(12) United States Patent
Lin et al.

(10) Patent No.: US 10,906,288 B2
(45) Date of Patent: Feb. 2, 2021

(54) METHOD FOR MANUFACTURING DISPLAY DEVICE

(71) Applicant: InnoLux Corporation, Miao-Li County (TW)

(72) Inventors: Wen-Chien Lin, Miao-Li County (TW); Kuo-Jung Fan, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 0 days.

(21) Appl. No.: 16/377,259

(22) Filed: Apr. 8, 2019

(65) Prior Publication Data

US 2020/0316932 A1   Oct. 8, 2020

(51) Int. Cl.
*H01L 21/00* (2006.01)
*B32B 43/00* (2006.01)
*H01L 27/12* (2006.01)

(52) U.S. Cl.
CPC ........ *B32B 43/006* (2013.01); *H01L 27/1262* (2013.01); *B32B 2457/20* (2013.01)

(58) Field of Classification Search
None
See application file for complete search history.

(56) References Cited

U.S. PATENT DOCUMENTS 9,443,915 B2 * 9/2016 Kim ................... H01L 51/56
2003/0134488 A1 * 7/2003 Yamazaki ......... G02F 1/133305
438/455

* cited by examiner

*Primary Examiner* — Jack S Chen
(74) *Attorney, Agent, or Firm* — Winston Hsu

(57) ABSTRACT

A method for manufacturing a display device is disclosed, the method at least includes the following step: Firstly, a temporary substrate is provided, a hydrogen containing structure is formed on the temporary substrate, a polymer film is formed on the hydrogen containing structure, and a display element is formed on the polymer film. Afterwards, a laser beam process is performed, to focus a laser beam on the hydrogen containing structure, and the temporary substrate is then removed.

19 Claims, 5 Drawing Sheets

METHOD FOR MANUFACTURING DISPLAY DEVICE

BACKGROUND OF THE DISCLOSURE

1. Field of the Disclosure

The present disclosure relates to a method for manufacturing a display device. More particularly, the present disclosure relates to a method of separating a layer or a substrate from a display device.

2. Description of the Prior Art

As a current display device, a liquid crystal display (LCD), a plasma display panel (PDP), an active matrix organic light emitting display (AM OELD), and the like have been used.

Display devices such as smartphones, tablets, notebooks, monitors, and TVs, have become indispensable necessities in modern society. With the flourishing development of such portable electronic products, consumers have high expectations regarding the quality, functionality, or price of such products. These electronic products are often provided with communications capabilities.

However, some difficulties may be encountered in the manufacture of the display devices. Accordingly, a method for manufacturing the display devices that improves display quality is needed.

SUMMARY OF THE DISCLOSURE

The present disclosure provides a method for manufacturing a display device, the method at least includes the following steps: Firstly, a temporary substrate is provided, a hydrogen containing structure is formed on the temporary substrate, a polymer film is formed on the hydrogen containing structure, and a display element is formed on the polymer film. Afterwards, a laser beam process is performed, to focus a laser beam on the hydrogen containing structure, and the temporary substrate is then removed.

The present disclosure provides a method for separating a display device (e.g. a flexible display device) from a supporting substrate, without deforming or damaging the display device when debonding the display device formed on the supporting substrate. By the method provided by the present disclosure, the quality or production yield of the display device can be improved.

These and other objectives of the present disclosure will no doubt become obvious to those of ordinary skill in the art after reading the following detailed description of the embodiment that is illustrated in the various figures and drawings.

BRIEF DESCRIPTION OF THE DRAWINGS

FIGS. 6-7 show the schematic diagrams of a display device according to a third embodiment of the present disclosure.

DETAILED DESCRIPTION

The present disclosure may be understood by reference to the following detailed description, taken in conjunction with the drawings as described below. It is noted that, for purposes of illustrative clarity and being easily understood by the readers, various drawings of this disclosure show a portion of the touch display device, and certain elements in various drawings may not be drawn to scale. In addition, the number and dimension of each device shown in drawings are only illustrative and are not intended to limit the scope of the present disclosure.

Certain terms are used throughout the description and following claims to refer to particular components. As one skilled in the art will understand, electronic equipment manufacturers may refer to a component by different names. This document does not intend to distinguish between components that differ in name but not function. In the following description and in the claims, the terms "include", "comprise" and "have" are used in an open-ended fashion, and thus should be interpreted to mean "include, but not limited to . . . ".

It will be understood that when an element or layer is referred to as being "on" or "connected to" another element or layer, it can be directly on or directly connected to the other element or layer, or intervening elements or layers may be presented. In contrast, when an element is referred to as being "directly on" or "directly connected to" another element or layer, there are no intervening elements or layers presented.

It should be noted that the technical features in different embodiments described in the following can be replaced, recombined, or mixed with one another to constitute another embodiment without departing from the spirit of the present disclosure.

In addition, the phrase "in a range from a first value to a second value" indicates the range includes the first value, the second value, and other values in between.

Figure 1:
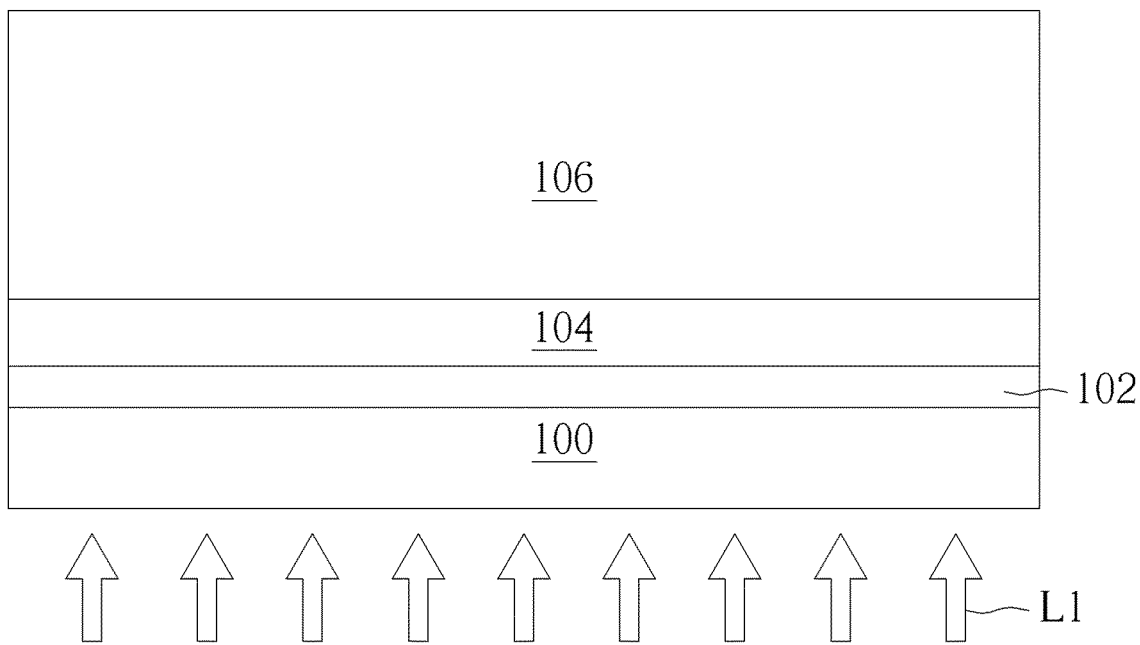
FIGS. 1-2 show the schematic diagrams of a display device according to a first embodiment of the present disclosure.
Figure 2:
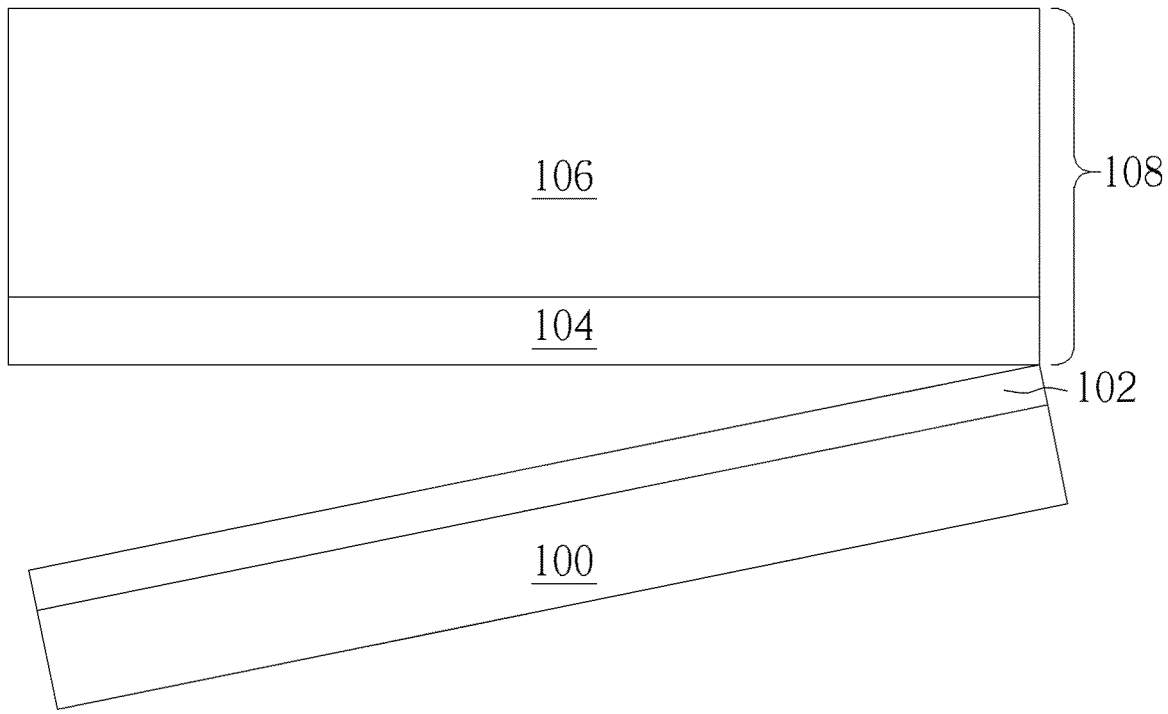

Referring to FIGS. 1-2, which show the schematic diagram of a display device according to a first embodiment of the present disclosure. In the first embodiment of the preset disclosure, a temporary substrate 100 is provided, and a hydrogen containing structure 102 is formed on the temporary substrate 100. Besides, a polymer film 104 is formed on the hydrogen containing structure 102, and a display element 106 is formed on the polymer film 104. In this embodiment, the polymer film 104 may directly contact the hydrogen containing structure 102.

In this embodiment, the temporary substrate 100 may include a glass substrate, ceramic substrate, other suitable substrates, or a combination thereof. The temporary substrate 100 may be a rigid substrate. The material of the temporary substrate 100 may include suitable transparent materials, and a transmittance of the temporary substrate 100 at the peak wavelength is greater than 0.75 (which means, when a light source penetrates the temporary substrate 100, the ratio of the intensity of the light source passing through to the intensity of the original light source is above 75%) and less than or equal to 1 (0.75<transmittance≤1). The hydrogen containing structure 102 can include an amorphous silicon (a-Si) layer for example, which contains hydrogen (H). However, the present disclosure is not limited thereto, the hydrogen containing structure 102 may comprise other suitable materials, such as nitride (e.g. SiNx), polymer or a combination thereof. In this embodiment, the hydrogen containing structure 102 include an amorphous silicon film, and in the following steps, the temporary substrate 100 and the hydrogen containing structure 102 will be removed from the polymer film 104.

The polymer film 104 may be a flexible transparent layer, in one embodiment of the present disclosure, the polymer film 104 can include a polyimide film, but not limited thereto. The polymer film 104 can be used as a protective layer or a substrate for the display element 106, to protect the components of the display element 106 (such as some thin film transistors, TFTs). The display element 106 can include any element used in a display device. For example, the display element 106 can include a liquid crystal (LC) cell, an organic light emitting diode (OLED), quantum dots light emitting diode (QLED or QD-LED), an inorganic light emitting diode (LED), micro LED, mini LED, quantum dot (QD), fluorescence, phosphor, other suitable display elements, or a combination thereof. Other electronic elements may be formed between the polymer film 104 and the display element 106, but not limited thereto.

In the present disclosure, the purpose for forming the temporary substrate 100 and the hydrogen containing structure 102 under the polymer film 104 is to improve the structural strength of the display devices during the manufacturing process or to improve the process yield. It can be described more detail in the following paragraphs:

The display device may include a flexible display device, a touch display device, a curved display device, a tiled display device, other suitable display device, or a combination thereof, but it is not limited thereto. The display device may include a flexible substrate. However, a flexible substrate may be curved during various manufacturing processes, and the alignment may be deviated.

To improve the accuracy of the alignment, a temporary bonding/debonding scheme may be suggested. Ina manufacturing process of the display device, a flexible substrate (e.g. the polymer film 104) may be formed or bonded on a supporting substrate (e.g. the temporary substrate 100) for the subsequent processes by a coating process or a laminating process. The flexible substrate may be debonded from the supporting substrate when some of the processes are finished.

In case where there is no hydrogen containing structure, one method of separating the temporary substrate 100 from the polymer film 104 is to focus a laser beam L1 on the polymer film 104 to break the bonds between the polymer film 104 and the temporary substrate 100 (the method can also be called as a laser lift-off process (LLO) in the following paragraphs). However, according to the applicant's experimental results, it is found that when the polymer film 104 is directly irradiated by the laser beam, some ashes will be remained on the exposed surface of the polymer film 104. Since other components need to be formed on the surface of the polymer film 104 (for example, a polarizer) in the subsequent processes, if ashes are left on the surface of the polymer film 104, it will be disadvantageous for subsequent formation of other components.

Therefore, the residual ashes may need to be reduced. In another embodiment of the present disclosure, as shown in FIGS. 1-2, a hydrogen containing structure 102 may be formed between the polymer film 104 and the temporary substrate 100. At least one laser beam L1 may be focused on the hydrogen containing structure 102 when removing the temporary substrate 100 from the polymer film 104. The hydrogen containing structure 102 can be formed by, for example, a chemical vapor deposition (CVD) process, a low-pressure CVD process ora plasma CVD process. After forming the display element 106, the hydrogen containing structure 102 (such as an a-Si layer) is irradiated and heated by the laser beam L1 through the transparent temporary substrate 100 to separate the polymer film 104 from the hydrogen containing structure 102. More detail, in this case, the hydrogen containing structure 102 includes hydrogen, and the hydrogen gas generated by the laser irradiation separates the polymer film 104 and the hydrogen containing structure 102. In this embodiment, a peak wavelength of the laser beam L1 is ranged from 306 nm to 310 nm, such as 308 nm, and an energy intensity of the laser beam L1 is greater than 400 $mJ/cm^2$, but the present disclosure is not limited thereto.

In this embodiment, the hydrogen containing structure 102 includes an amorphous silicon film which may contain hydrogen (H). In one embodiment of the present disclosure, the H content is about 10 to 30 atomic %. In this way, with a predetermined content of hydrogen, hydrogen gas is released by irradiation of the laser beam L1 to generate internal pressure in the hydrogen containing structure 102, thereby causing force to separate the hydrogen containing structure 102 and the polymer film 104. The hydrogen (H) content of the amorphous silicon film can be adjusted by appropriately setting deposition conditions, for example, such as the gas composition, gas pressure, gas atmosphere, gas flow rate, temperature, substrate temperature, input power, etc. In this embodiment, in order to make the hydrogen containing structure 102 contain enough hydrogen, a thickness of the hydrogen containing structure 102 (the amorphous silicon film) may be greater than or equal to 50 nm and less than or equal to 100 nm. The thickness of the hydrogen containing structure 102 may be measured as an averaged thickness of 3 to 5 thicknesses in a cross-sectional view. In addition, during the process of forming the hydrogen containing structure 102, hydrogen gas is introduced into a chamber (not shown).

Figure 3:
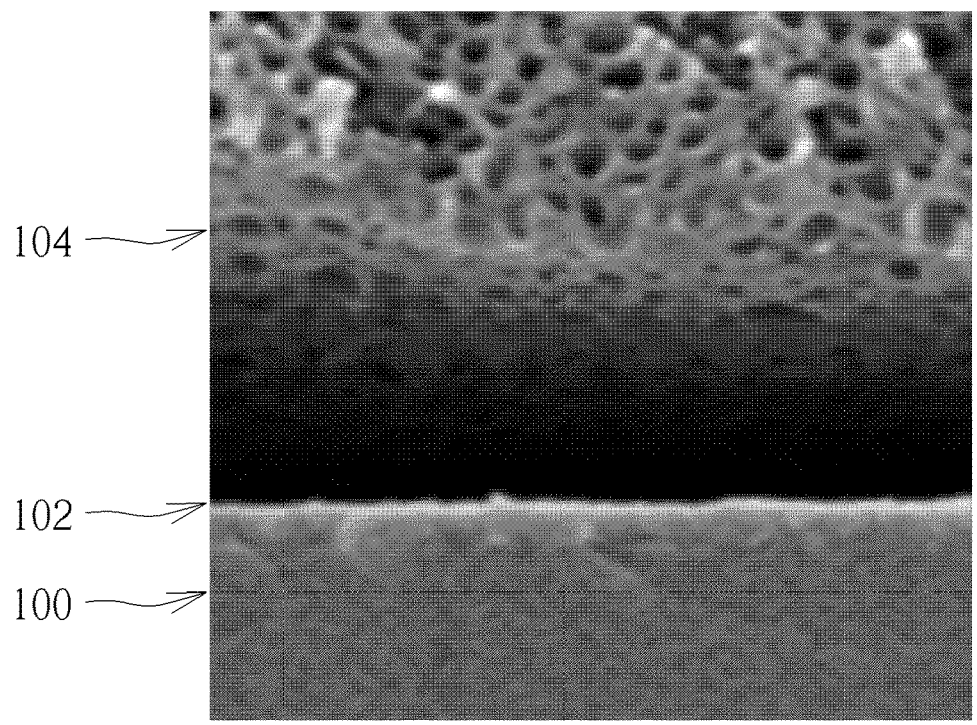
FIGS. 3-4 show SEM (scanning electron microscope) cross-sectional views of the surface of different display devices according to various embodiments.
Figure 4:
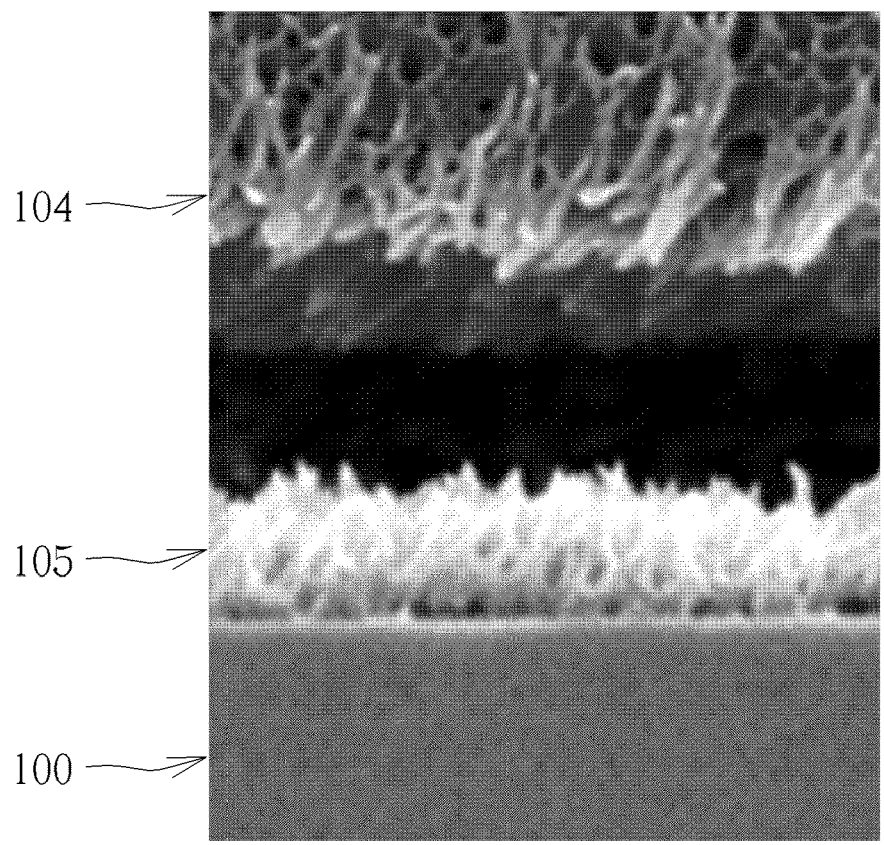

Applicants have found that the thickness and hydrogen content of the hydrogen containing structure 102 may affect of the residual ashes. In more detail, since the hydrogen containing structure 102 disposed between the polymer film 104 and the temporary substrate 100 in the present disclosure, if the thickness of the hydrogen containing structure 102 is insufficient, the hydrogen content of the hydrogen containing structure 102 may be not enough to separate the hydrogen containing structure 102 from the polymer film 104. FIGS. 3-4 show scanning electron microscope (SEM) images of the structure of different display devices in cross-sectional views according to various embodiments. As shown in FIG. 3, in this embodiment, the thickness of the hydrogen containing structure 102 (which is an amorphous silicon film as an example) on the temporary substrate 100 is greater than 50 nm (e.g. 62 nm). After focusing a laser beam on the hydrogen containing structure 102, the polymer film 104 has a substantially smooth surface without residual ashes, and the roughness (Ra) of the surface of the polymer film 104 is less than 5 nm and greater than 0 nm, but not limited thereto. However, in another case, as shown in FIG. 4, there is no hydrogen containing structure disposed between the polymer film 104 and the temporary substrate 100. After focusing a laser beam on the polymer film 104, when viewed from the SEM cross-section view (FIG. 4), some ashes 105 are still remained on the surface of the polymer film 104, and the roughness (Ra) of the surface of the polymer film 104 is greater than 12 nm In some embodiments of the preset disclosure, hydrogen can be contained in the hydrogen containing structure 102 according to the process conditions. In one example, hydrogen ions may be implanted after the hydrogen containing structure 102 is formed. Therefore, at least a predetermined amount of hydrogen can be contained in the amorphous silicon film regardless of the process conditions for amorphous silicon.

It is worth noting that after the hydrogen containing structure 102 is focused by the laser beam L1, it may become easy to be removed, and during the step of removing the hydrogen containing structure 102, the temporary substrate 100 may be also removed at the same time. In this step, the remaining display element 106 and the polymer film 104 can be defined as a display device 108, and the remaining display device 108 (the polymer film 104 and the display element 106) will be subjected to subsequent steps, such as attaching a polarizer or combining with a backlight module to produce the desired display device.

The following description will detail the different embodiments of the method for forming a display device of the present disclosure. To simplify the description, the following description will detail the dissimilarities among the different embodiments, and the identical features will not be redundantly described. In order to compare the differences between the embodiments easily, the identical components in each of the following embodiments are marked with identical symbols.

Figure 5:
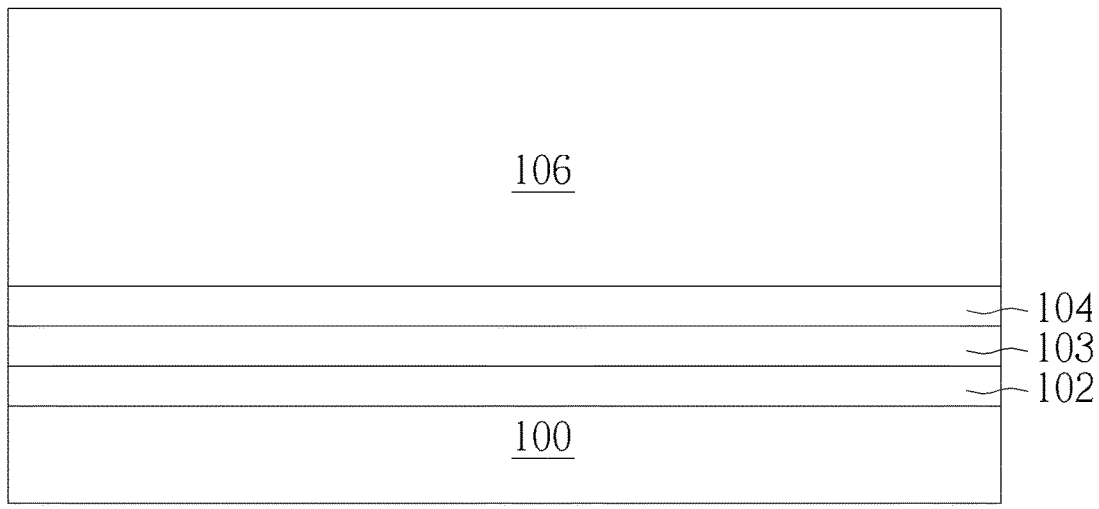
FIGS. 5-6 show the schematic diagrams of a display device according to a second embodiment of the present disclosure.

Referring to FIG. 5, which shows the schematic diagram of a display device according to a second embodiment of the present disclosure. In this embodiment, a silicon nitride film 103 may be further formed between the polymer film 104 and the hydrogen containing structure 102 (such as an amorphous silicon film). The purpose of forming the silicon nitride film 103 is that the silicon nitride film 103 may better bonding with the polymer film 104 and the hydrogen containing structure 102, or to decrease the degree of bending of the flexible polymer film 104 during fabrication. In the subsequent steps, the silicon nitride film 103 will be removed with the hydrogen containing structure 102 and the temporary substrate 100 after the laser beam process (the LLO process).

Except for the features mentioned above, the other components, material properties, and manufacturing method of this embodiment are similar to the first embodiment detailed above and will not be redundantly described.

Figure 6:
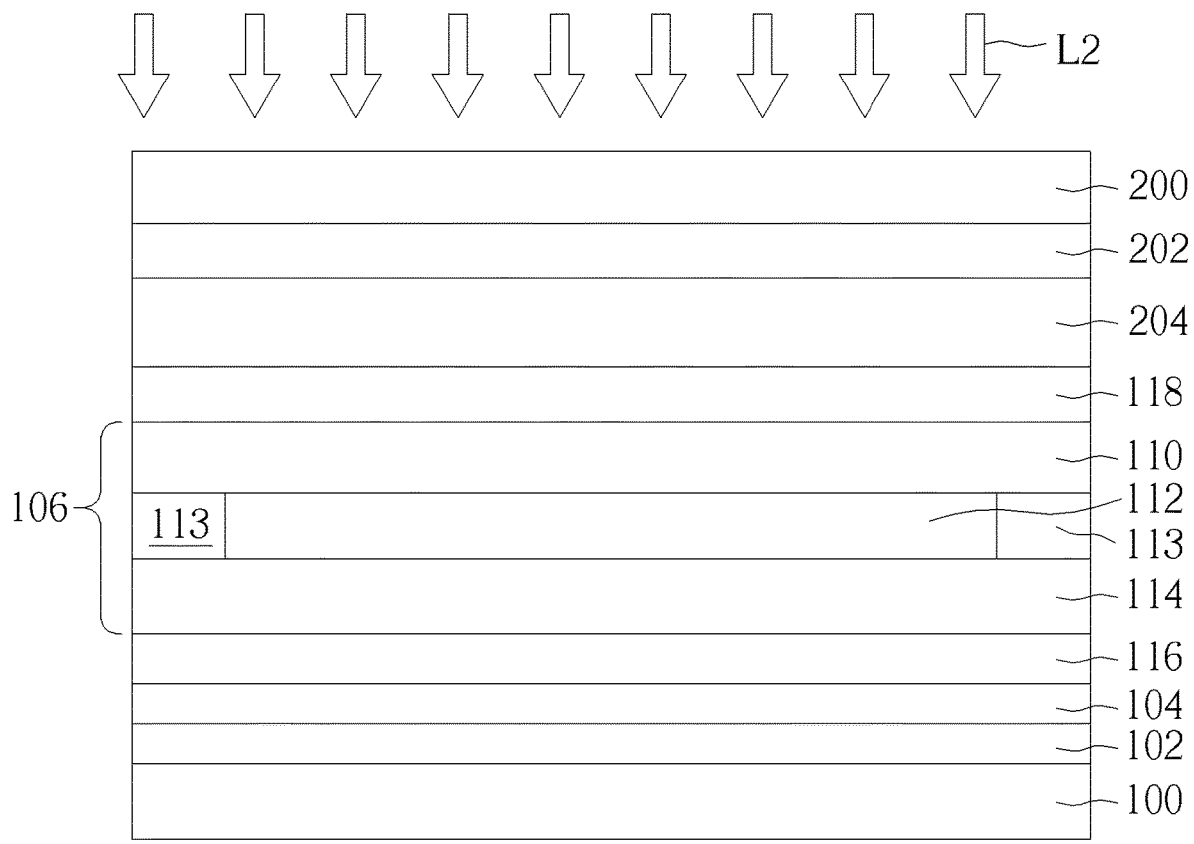
Figure 7:
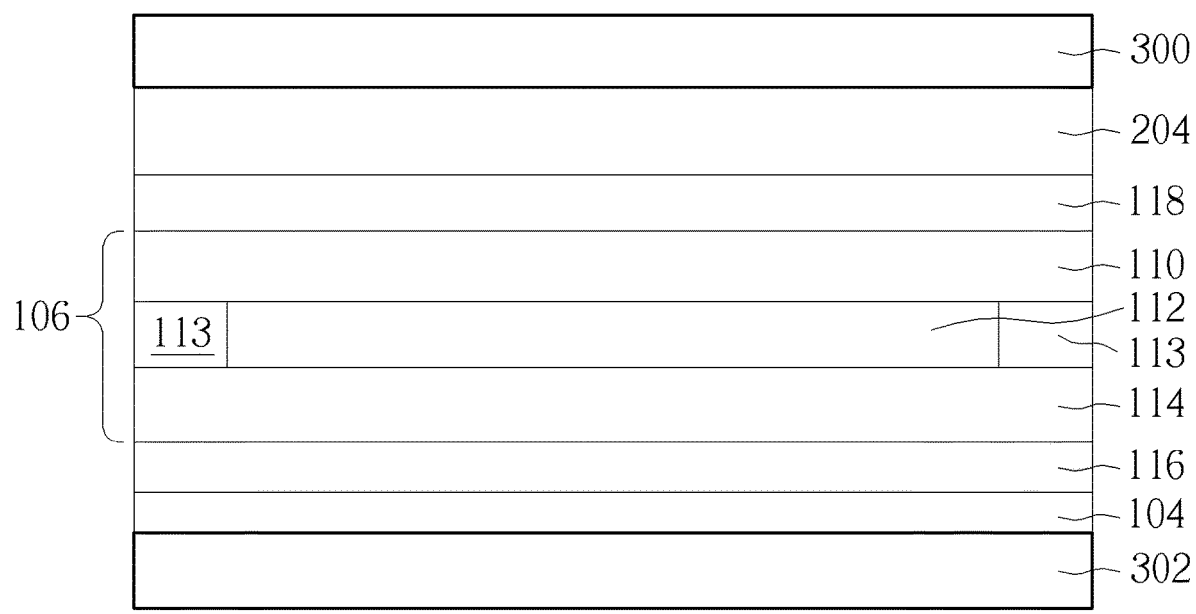

Referring to FIGS. 6-7, which show the schematic diagrams of a display device according to a third embodiment of the present disclosure. In this embodiment, a second temporary substrates 200 and a second hydrogen containing structure 202 may be additionally formed at an opposite side (the back side) of the display element 106. The second hydrogen containing structure 202 may be disposed between the second temporary substrates 200 and a second polymer film 204. In other words, in this embodiment, the display element 106 is disposed between the polymer film 104 and the second polymer film 204. Besides, in this embodiment, taking the display element 106 is a LCD-type display element as an example, the display element 106 may include a color filter (CF) layer 110, a liquid crystal (LC) layer 112, a sealant layer 113, and a thin film transistor (TFT) layer 114. Besides, the display element 106 can be disposed between one buffer layer 116 and another buffer layer 118, but not limited thereto. The material of the buffer layer 116 or the buffer layer 118 can include oxide (e.g. siliconoxide (SiOx)), nitride (e.g. siliconoxide (SiNy)), or a combination thereof, but not limited thereto. The purpose of forming the buffer layer 116 or the buffer layer 118 is to improve the adhesion between the polymer film 104 (or the second polymer film 204) and the display element 106.

As shown in FIG. 6, the second hydrogen containing structure 202 may be irradiated by a second laser beam L2, and the second hydrogen containing structure 202 can be removed with the second temporary substrates 200 easily from the second polymer film 204. The parameters of laser beam L2 may be the same or similar to that of the laser beam L1 described above, the description will not be repeated here.

As shown in FIG. 7, after the hydrogen containing structure 102 and the second hydrogen containing structure 202 are removed, other components may be further formed on at least one side of the display element 106. For example, a polarizer 300 and a backlight module 302 are disposed at opposite sides of the display element 106, respectively. In one example, another polarizer (not shown) may be disposed between the polymer film 104 and the backlight module 302. The above components are known in the art and will not be described here. In addition to this, other elements may be additionally formed, and the present disclosure is not limited thereto.

In another embodiment of the present disclosure, the hydrogen containing structures 102 and 202 may be removed by different methods. For example, one of the hydrogen containing structures 102 and 202 can be removed by the laser lift-off (LLO) process mentioned above, and the other hydrogen containing structure may be removed by a mechanical lift-off (MLO) process. The MLO process belongs to the well-known technology in the art, and will not be described here. It should also be within the scope of the present disclosure. However, the present disclosure is not limited thereto, other suitable lift-off processes can be used in the present disclosure.

Figure 8:
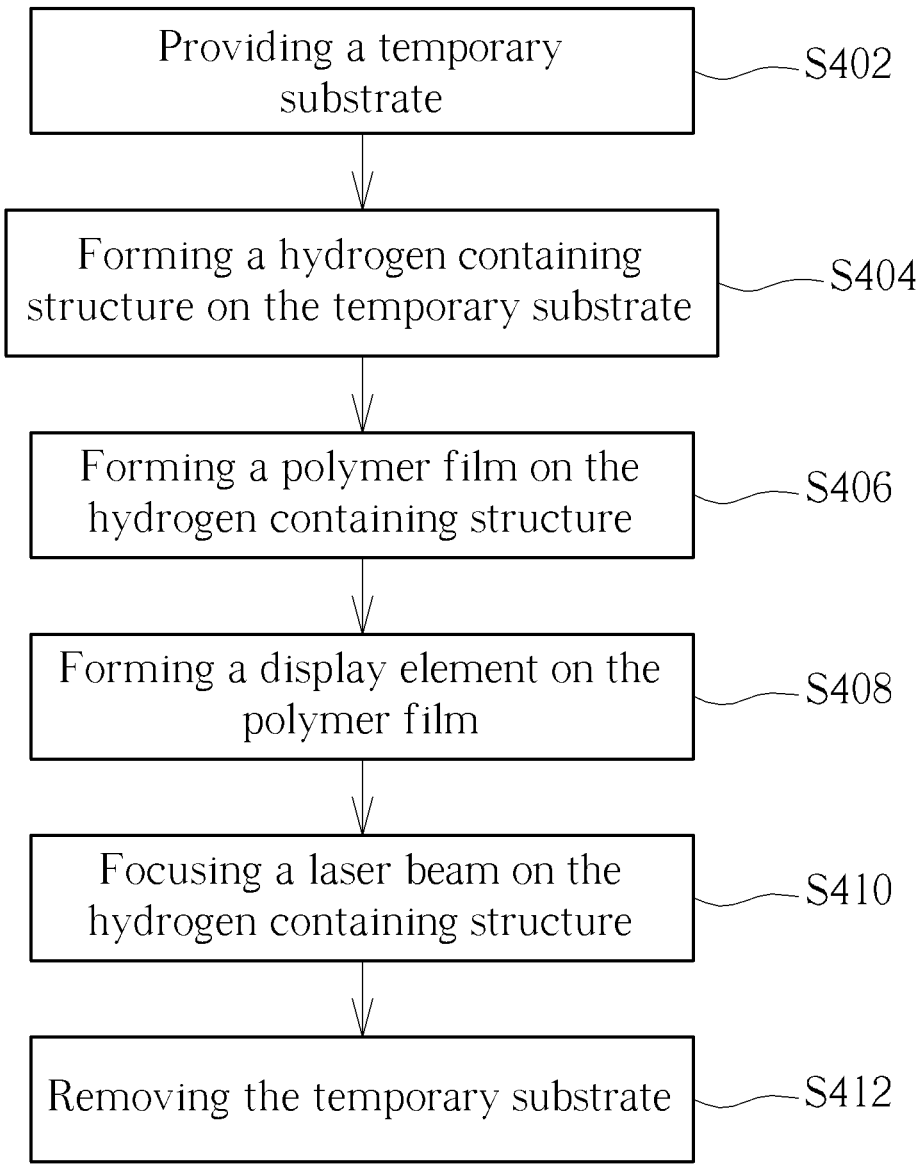
FIG. 8 shows the flow chart of the method for separating a display device from a supporting substrate.

FIG. 8 shows the flow chart of the method for separating a display device from a supporting substrate according to one embodiment of the present disclosure. Please refer to FIG. 8 and please also refer to FIGS. 1-7 mentioned above, a method 400 includes: step 402: providing a temporary substrate (100); step 404: forming a hydrogen containing structure (102) on the temporary substrate (100); step 406: forming a polymer film (104) on the hydrogen containing structure (102); step 408: forming a display element (106) on the polymer film (104); step 410: focusing a laser beam (L1) on the hydrogen containing structure (102); and step 412: removing the temporary substrate (100). However, the above step flow is only an example of the disclosure, and the present disclosure is not limited thereto, the present disclosure may be adjusted based on the above steps (for example, adding or deleting some steps).

In summary, the present disclosure provides a method for separating a display device from a supporting substrate to reduce the degree of deforming or damaging the display device when debonding the display device formed on the supporting substrate. By the method provided by the present disclosure, the quality or production yield of the display device can be improved.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A method for manufacturing a display device, comprising:
   providing a temporary substrate;
   forming a hydrogen containing structure on the temporary substrate;
   forming a polymer film on the hydrogen containing structure, wherein the polymer film contacts the hydrogen containing structure directly;
   forming a display element on the polymer film;
   focusing a laser beam on the hydrogen containing structure; and
   removing the temporary substrate and the hydrogen containing structure, wherein the hydrogen containing structure is separated from the polymer film.

2. The method for manufacturing the display device according to claim 1, wherein the hydrogen containing structure comprises an amorphous silicon film.

3. The method for manufacturing the display device according to claim 2, wherein the amorphous silicon film is removed in the step of removing the temporary substrate.

4. The method for manufacturing the display device according to claim 2, wherein a thickness of the amorphous silicon film is greater than or equal to 50 nm and less than or equal to 100 nm.

5. The method for manufacturing the display device according to claim 2, wherein the hydrogen containing structure further comprises a silicon nitride film disposed between the polymer film and the amorphous silicon film.

6. The method for manufacturing the display device according to claim 5, wherein the hydrogen containing structure is removed in the step of removing the temporary substrate.

7. The method for manufacturing the display device according to claim 1, wherein a peak wavelength of the laser beam is ranged from 306 nm to 310 nm.

8. The method for manufacturing the display device according to claim 7, wherein a transmittance of the temporary substrate at the peak wavelength is greater than 0.75 and less than or equal to 1.

9. The method for manufacturing the display device according to claim 1, wherein in the step of forming the hydrogen containing structure, a hydrogen gas is introduced into a chamber.

10. The method for manufacturing the display device according to claim 1, wherein the display element comprises a color filter layer.

11. The method for manufacturing the display device according to claim 1, wherein after the temporary substrate is removed, a roughness of an exposed surface of the polymer film is less than 5 nm and greater than 0 nm.

12. The method for manufacturing the display device according to claim 11, further comprising disposing a polarizer on the polymer film.

13. The method for manufacturing the display device according to claim 1, wherein the display element comprises a thin film transistor layer.

14. The method for manufacturing the display device according to claim 1, wherein an energy intensity of the laser beam is greater than 400 $mJ/cm^2$.

15. The method for manufacturing the display device according to claim 1, wherein the display element comprises a liquid crystal (LC) cell, an organic light emitting diode, a quantum-dot light emitting diode, a micro LED, a mini LED, or an inorganic LED.

16. The method for manufacturing the display device according to claim 1, further comprising at least one buffer layer disposed between the polymer film and the display element.

17. The method for manufacturing the display device according to claim 16, wherein a material of the buffer layer comprises oxide, nitride, or a combination thereof.

18. The method for manufacturing the display device according to claim 1, further comprising forming a second hydrogen containing structure and a second temporary substrate on a side of the display element away from the polymer film.

19. The method for manufacturing the display device according to claim 18, further comprising focusing a second laser beam on the second hydrogen containing structure.

* * * * *